United States Patent [19]

Steele

[11] 4,279,670

[45] Jul. 21, 1981

[54] SEMICONDUCTOR DEVICE MANUFACTURING METHODS UTILIZING A PREDETERMINED FLOW OF REACTIVE SUBSTANCE OVER A DOPANT MATERIAL

[75] Inventor: S. Robert Steele, Sudbury, Mass.

[73] Assignee: Raytheon Company, Lexington, Mass.

[21] Appl. No.: 64,339

[22] Filed: Aug. 6, 1979

[51] Int. Cl.³ .................. H01L 21/205; H01L 29/207
[52] U.S. Cl. ................................. 148/175; 148/174;
 156/610; 156/612; 252/62.36 A; 357/13;
 357/15; 357/64; 357/89; 427/85; 427/87;
 427/255.1; 427/248.1
[58] Field of Search .............. 148/174, 175; 156/610,
 156/612; 427/87, 8 S, 248 R, 248 A; 252/62.36
 A; 357/13, 15, 64, 89, 90

[56] References Cited

U.S. PATENT DOCUMENTS

| | | | |
|---|---|---|---|
| 3,635,771 | 1/1972 | Shaw ..................................... | 148/175 |
| 3,767,472 | 10/1973 | Chicotka et al. ................. | 148/175 X |
| 3,836,408 | 9/1974 | Kasano ................................. | 148/175 |
| 3,856,585 | 12/1974 | Moon et al. ......................... | 148/175 |
| 3,888,705 | 6/1975 | Fletcher et al. .................... | 148/175 |
| 3,901,746 | 8/1975 | Boucher .............................. | 148/175 |
| 3,979,235 | 9/1976 | Boucher .............................. | 148/175 |
| 4,007,074 | 2/1977 | Ogirima et al. ..................... | 148/175 |
| 4,039,357 | 8/1977 | Bachmann et al. ................. | 148/175 |
| 4,063,974 | 12/1977 | Fraas ................................... | 148/175 |
| 4,106,959 | 8/1978 | DiLorenzo et al. ................. | 148/175 |
| 4,116,733 | 9/1978 | Olsen et al. ........................ | 148/175 |
| 4,144,116 | 3/1979 | Jacob et al. ...................... | 148/175 X |

OTHER PUBLICATIONS

Dazai et al., "Preparation . . . Semi-Insulating GaAs . . . Iron Doping," Extracted from Fujitsu Sci. & Tech. Journal, vol. 12, No. 2 (15 Jun. 1976).
Nicholl, F. H., "Use of Close Spacing . . . Epitaxial Layers . . . ," J. Electrochem. Soc., vol. 110, No. 11, Nov. 1963, pp. 1165-1167.
Mizuno et al., "Epitaxial Growth of Semi-Insulating Gallium Arsenide," Japanese J. of Applied Physics, vol. 10, No. 2, Feb. 1971, pp. 208-212.
Silvestri et al., "Incorporation of Zinc in Vapor Grown Gallium Arsenide," J. Electrochem. Soc., vol. 111, No. 10, Oct. 1964, pp. 1164-1167.
Sidorov et al., "Behavior of Impurities . . . Vapor Deposition of GaAs," J. Electrochem. Soc., vol. 123, No. 5, May 1976, pp. 698-702.
Conrad et al., "Incorporation of Zinc . . . GaAs . . . ," J. Electrochem. Soc., vol. 113, No. 2, Feb. 1966, pp. 199-201.
Fergusson et al., "Transport of Gallium Arsenide . . . Reaction," J. Electrochem. Soc., vol. 111, No. 5, May 1964, pp. 585-592.
Hoyt et al., "Prep. of Epitaxial Semi-Insulating GaAs by Iron Doping," J. Electrochem. Soc., vol. 113, No. 3, Mar. 1966, pp. 296-297.

*Primary Examiner*—L. Dewayne Rutledge
*Assistant Examiner*—W. G. Saba
*Attorney, Agent, or Firm*—Richard M. Sharkansky; Joseph D. Pannone

[57] ABSTRACT

A method for producing doped gallium arsenide semiconductor layers for semiconductor devices wherein a predetermined flow of a reactive substance is directed over a material having a dopant and a relatively low vapor pressure. The reactive substance chemically reacts with the material to produce a corresponding flow of a doping vapor. The doped gallium arsenide semiconductor layer is deposited on a gallium arsenide substrate by vapor phase epitaxy from material including the doping vapor. With such method, accurate control of the magnitude of the dopant is obtained by control of the reactive substance, the doping material being supplied by a non-volatile source.

13 Claims, 5 Drawing Figures

SEMICONDUCTOR DEVICE MANUFACTURING METHODS UTILIZING A PREDETERMINED FLOW OF REACTIVE SUBSTANCE OVER A DOPANT MATERIAL

BACKGROUND OF THE INVENTION

This invention relates generally to semiconductor devices and manufacturing methods and more particularly to semiconductor devices formed by vapor phase epitaxy.

As is known in the art, the performance of many semiconductor devices depends on the doping profile of materials from which the devices are manufactured. It is particularly important to the yield and cost of the semiconductor devices to be able to control doping levels of such materials. This is often accomplished by introducing a controlled quantity of a selected doping substance into the growth region of a vapor phase epitaxial reaction to dope layers of a semiconductor device as they are being deposited. In forming n-type gallium arsenide IMPATT diodes using vapor phase epitaxial deposition of an n-type gallium arsenide layer, for example, doping vapors, such as hydrogen sulfide or silane, are introduced into a reaction chamber along with materials including gallium and arsenic which produce the vapor phase epitaxial deposition of the layer of gallium arsenide. Here it is noted that these dopants are gases at room temperature and therefore doping concentrations may be controlled precisely using conventional gas handling equipment. To obtain relatively low doping concentrations of such n-type dopants proper mixing of the doping gas with an inactive gas, such as hydrogen or helium, may be used.

While such technique enables accurate and practical control of doping concentrations because the dopants are readily available in gaseous form, such technique is not practical for dopants which exist at room temperatures in solid or liquid form. More specifically, while such doping techniques may be used in the formation of n-type layers of gallium arsenide, such technique is not readily available in the formation of p-type layers of gallium arsenide because many p-type dopants for gallium arsenide, such as cadmium, zinc, beryllium, magnesium and manganese do not exist in gaseous form at room temperature. It follows, then, that while such vapor phase epitaxy deposition techniques may be used to form single drift n-type gallium arsenide IMPATT diodes, difficulties have been encountered in the formation of double drift gallium arsenide IMPATT diodes having both high quality n-type layers and high quality p-type layers of gallium arsenide.

One technique suggested to obtain p-type gallium arsenide layers is to provide metal organic compounds of zinc or cadmium, such as zinc alkyls, either dimethyl or diethyl zinc, which are liquid at room temperature with a sufficiently high vapor pressure to enable transport of surface vapors of such liquid by a carrier gas, such as hydrogen or helium, to the epitaxial reaction chamber along with the gases and vapors used to vapor phase epitaxially deposit a layer of gallium arsenide. The transported vapors are sometimes passed through a condenser prior to being introduced into the reaction chamber. The doping concentration of the deposited layer is controlled by: Controlling the quantity of the carrier gas over the surface of the metal organic compound; controlling the temperature of the metal organic compound to control the vapor pressure of the doping vapors; and, controlling the temperature of the condenser to control the amount of dopant which is introduced into the chamber. Such control is relatively imprecise and ineffective, particularly where doping concentrations of less than $10^{16}$ per $cm^3$ are required.

Another technique suggested for providing p-type doped gallium arsenide layers during vapor phase epitaxial deposition is through the direct vapor vaporization of the dopant from its solid or liquid state. To achieve a controlled doping with such technique the doping material must generally be held at a very precise temperature, the flow of a carrier gas must be carefully regulated, and the temperature of all surfaces between the heated dopant and the substrate on which the layer is being deposited must be high enough to prevent dopant condensation. In addition, the dopant vapor must generally experience no, or little, uncontrolled reactions upstream of the substrate. For example, solid dopants which have been suggested for direct vaporization in providing p-type doped gallium arsenide layers by vapor phase epitaxy are cadmium and zinc. Here a small amount of the metal is heated with a metered flow of a carrier gas passing over the surface of the metal to carry sublimed vapors over such surface into the reactor. As noted, precautions must be taken to ensure that all parts of the vapor path between the zinc or cadmium and the substrate are held at temperatures above that of the dopant source; otherwise, condensation occurs and the doping is unpredictable. To change doping levels or to initiate or terminate doping the carrier gas flow is changed or the temperature of the metal is changed. Where it is desired to form doping spikes a large increase in the flow rate of the gas to provide such doping spikes adversely affects the growth of the doped layer. Further, rapid changes in metal temperature are not practical because of time lags. Consequently, such technique is not readily suitable where it is desired to sharply change doping concentrations as when it is desired to form a p-type doping spike having a background concentration near $3 \times 10^{15}$ per $cm^3$, a peak concentration near $10^{17}$ per $cm^3$ and a width of several tenths of a micrometer. Further, when it is desired to form double drift devices it is generally desired to efficiently inhibit the flow of p-type dopant from entering the reactor during deposition of n-type layers and this is not practical with valves because such valves must operate in the high temperature environment between the heated metal and the reaction chamber, such high temperature environment being necessary to prevent condensation as mentioned previously above. Alternatively, where such high temperature valves are not used, n-type doping compensation techniques have been suggested; however, such techniques require the addition of additional impurity atoms, thereby reducing carrier mobility and adversely affecting the electrical characteristics of the device.

An alternative technique suggested to obtain p-type doped layers includes the use of a p-type doped source of gallium arsenide. Zinc, for example, is added to a gallium source. The source material is transported by passing arsenic trichloride over such material. The zinc transports preferentially to the gallium and, therefore, the first runs after the addition of zinc to the source are heavily doped, and subsequent runs are less p-type doped. After a few runs, no p-type doping is obtained.

In still another method suggested, the reactive gas used in the vapor phase epitaxy deposition is also used to react with a dopant. Such technique does not provide for independent control of both the reactive transport and the doping.

In other semiconductor devices, such as gallium arsenide field effect transistors, the importance of chromium doping in producing semi-insulating substrate material for the deposition or implantation of layers is well known. However, commercially available chromium-doped gallium arsenide substrates are generally of variable quality and strongly influence the performance of devices made upon them. Two approaches have been suggested: The first requires that potential substrates be subjected to elaborate qualification procedures prior to use. However, this is costly, and the second procedure isolates the substrate from the active layers by the intermediate deposition of a highly resistive buffer layer. The buffer layer restricts the diffusion of impurities from the substrate into the active layer, sharpening the interface profile, and improving values of carrier mobility at the active layer-buffer interface. On the average, wafers with buffer layers produce devices with improved noise figures and gain when compared with unbuffered wafers. Nevertheless, it has been found that the properties of undoped buffer layers still depend upon substrate characteristics. Efforts have been made to improve the buffer layer quality by deliberately adding dopants during deposition. Iron doping was used in an $AsCl_3$—$N_2$—Ga open tube vapor phase epitaxy reactor by passing hydrogen chloride, formed by the thermal decomposition of arsenic trichloride, over heated iron to form $FeCl_2$ which was vaporized and carried into the reactor. This process, however, uses nitrogen as the carrier which is not generally compatible with forming silicon, n-type dopant layers as the active layer of the field effect device. Chromium dopant has been obtained by introducing vaporized chromyl chloride into an $AsCl_3$—$H_2$—Ga vapor phase epitaxy. Here chromyl chloride contains oxygen and reacts with hydrogen to form chromium oxide, much of which deposits on the heated walls of the dope tube. A part of the chromium oxide is reduced by hydrogen at the vapor phase epitaxy reactor temperatures to form chromium, which dopes the growing epitaxial layer. Resistivities of $10^8$ ohm-cm were reported for layers containing one ppm chromium, as long as the n-type background level was less than $5 \times 10^{15}$ cm$^{-3}$. The chromyl chloride process has several disadvantages, most of which can be attributed to its oxygen content. The high resistivity layers formed in this way are inevitably doped with oxygen as well as chromium, and this may not be desirable. Various parts of the vapor phase epitial system become coated with chromium oxides which can unintentionally contaminate the growing layers. In addition, the precise amount of chromium incorporated into the growing layer is not easily controlled. Iron doping has been used chiefly with low temperature growth processes, such as the $AsCl_3$—$N_2$—Ga system. However, the resistivities obtained with iron are poorer (approximately $10^5$ ohm-cm) than those obtained with chromium doping.

SUMMARY OF THE INVENTION

In accordance with the present invention a method for producing a doped gallium arsenide semiconductor layer comprises the steps of: Directing a predetermined flow of a reactive substance over a material having a dopant; chemically reacting the reactive substance with such material producing a corresponding flow of a doping vapor having the dopant and having a vapor pressure at a predetermined temperature an order of magnitude greater than the vapor pressure of the material at the predetermined temperature; and, depositing the doped gallium arsenide semiconductor layer on a gallium arsenide substrate by vapor phase epitaxy from material including a source of gallium and arsenic and the doping vapor.

The invention also relates to a method for producing a doped layer of gallium arsenide semiconductor layer comprising the steps of: Directing a predetermined flow of a reactive substance over a first material having as a substantial fractional element thereof a dopant; chemically reacting the reactive substance with such first material producing a corresponding flow of a doping vapor having the dopant; and depositing the doped gallium arsenide semiconductor layer on a gallium arsenide substrate by vapor phase epitaxy from a second material including a source of gallium and arsenic and the doping vapor, such second material and the doping vapor being transported to the substrate by a carrier gas or hydrogen, the flow of the carrier gas of hydrogen being independent of the flow of the reactive substance.

In a preferred embodiment of the invention doping vapor is a volatile compound of a predetermined p-type dopant generated by the chemical reaction between a low volatility material which includes the p-type dopant and the reactive substance. The chemical reaction takes place upstream of the substrate, the doping vapor being transported to the surface of the substrate by an appropriate carrier gas. The chemical reaction is relatively complete and rapid and consequently the flow of volatile product, i.e. the doping vapor, is substantially proportional to the flow of the reactive substance directed to the low volatility material. With such method, accurate control of the magnitude of p-type doping is obtained by control of the flow of the reactive vapor, the p-type doping material being supplied by a nonvolatile source.

More specifically, layers of gallium arsenide are deposited on a surface of a gallium arsenide substrate by vapor phase epitaxy from materials including sources of gallium and arsenic produced by passing arsenic trichloride and hydrogen over gallium. During this deposition a flow of a reactive substance of a compound of iodide such as iodine vapor $I_2$, or hydrogen iodine, HI, (or a compound of bromine, such as bromine vapor, $Br_2$, or hydrogen bromide, HBr) is directed to zinc arsenide, producing a volatile or gaseous doping vapor of zinc iodide (or zinc bromide) which is also directed to the surface of the gallium arsenide substrate, resulting in the vapor phase epitaxial deposition of a p-type doped layer of gallium arsenide, the magnitude of such p-type doping being related to the flow of the reactive substance directed to the zinc arsenide.

The method also relates to the formation of a reactive substance of iodine vapor comprising the step of passing an inactive gas through a source of iodine vapor to transport such iodine vapor to the material having the doping element.

The invention also relates to a method for producing a relatively narrow, high doping concentration layer disposed between a pair of lower doping concentration layers comprising the steps of: Directing a flow of a predetermined quantity of a reactive substance to a material having a doping element, the predetermined quantity being related to the doping concentration of the narrow high doping concentration layer; chemically reacting the predetermined quantity of the reactive substance with the material producing a flow of a corresponding quantity of a doping vapor; depositing such narrow high doping concentration layer on a layer of semiconductor material having a relatively low doping concentration, such deposition being by vapor phase epitaxy from materials including the doping vapor; and producing by vapor phase epitaxy a relatively lower doped semiconductor layer on the narrow highly doped concentration layer. Because the chemical reaction is such that the quantity of dopant transport is controlled by the quantity of reactive substance, and because control of the quantity of such reactive substance is relatively accurate and readily controllable, accurate control of the doping is achieved. Further, because the control of the quantity of the reactive substance is independent of the state of the material having the doping element, such material may be solid or liquid and precise doping control is achievable. Consequently, since many gallium arsenide p-type dopants exist more readily in a solid or liquid state, such method enables extremely accurate control of p-type gallium arsenide doping concentrations including the production of relatively narrow, high concentration p-type gallium arsenide layers.

The invention also relates to a method for producing double drift IMPATT diodes comprising the steps of: Forming at least one p-type doped gallium arsenide layer by vapor phase epitaxy, including the step of chemically reacting a substance with a material having a p-type doping element producing a doping vapor having the p-type doping element, and forming juxtaposed therewith at least one n-type doped gallium arsenide layer.

The invention also relates to a method for forming high quality chromium-doped gallium arsenide layers using vapor phase epitaxy. A volatile compound of the chromium doping element is generated by reaction between solid, low volatility, chromium and a reactive gas or vapor such as hydrogen iodide or iodine. The materials are reacted outside of the substrate zone and the doping vapor, chrome iodide, which result is transported to the wafer in an appropriate gas, hydrogen or helium. Ideally, the reaction is rapid and complete, so that the amount of chromium iodide formed is exactly proportional to the quantity of hydrogen iodide or iodine which is passed over the chromium. Ideally, the reaction will occur at a sufficiently low temperature so that the chromium vapor pressure is low enough such that chromium background doping is insignificant when no iodine or hydrogen iodide is flowing. The hydrogen iodide or iodine is diluted with a precise proportion of hydrogen or helium prior to passing over the heated chromium, and the flow of the mixture is controlled with commercially available gas handling equipment.

BRIEF DESCRIPTION OF THE DRAWINGS

The foregoing and other features of this invention, as well as the invention itself, may be more fully understood from the following detailed description read together with the accompanying drawings, in which.

DESCRIPTION OF THE PREFERRED EMBODIMENTS

Figure 1:
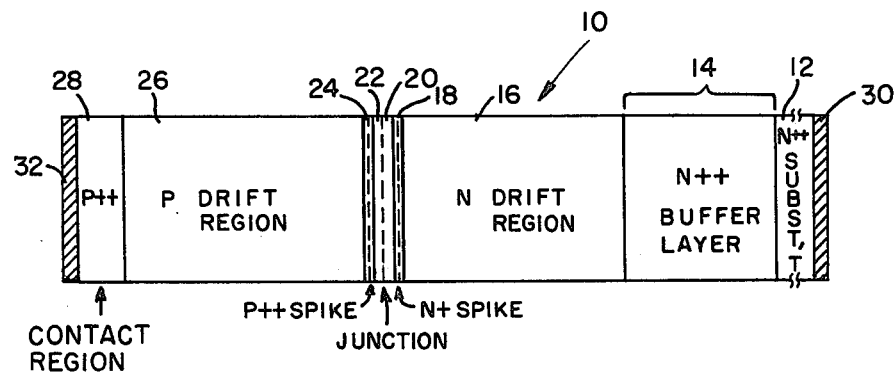
FIG. 1 is a diagrammatical sketch of a double drift IMPATT diode manufactured according to the invention.

Referring now to FIG. 1, a dynamic negative resistance type diode, here a double-drift IMPATT diode 10, is shown to include a gallium arsenide substrate 12 having a plurality of sequentially vapor phase epitaxially deposited layers 14, 16, 18, 20, 22, 24, 26, 28 of doped gallium arsenide formed on a surface of such substrate 12. A pair of electrical contacts 30, 32, here gold or gold alloys, is provided in ohmic contact with the gallium arsenide substrate 12 and vapor phase epitaxially deposited layer 28, as shown.

Figure 2:
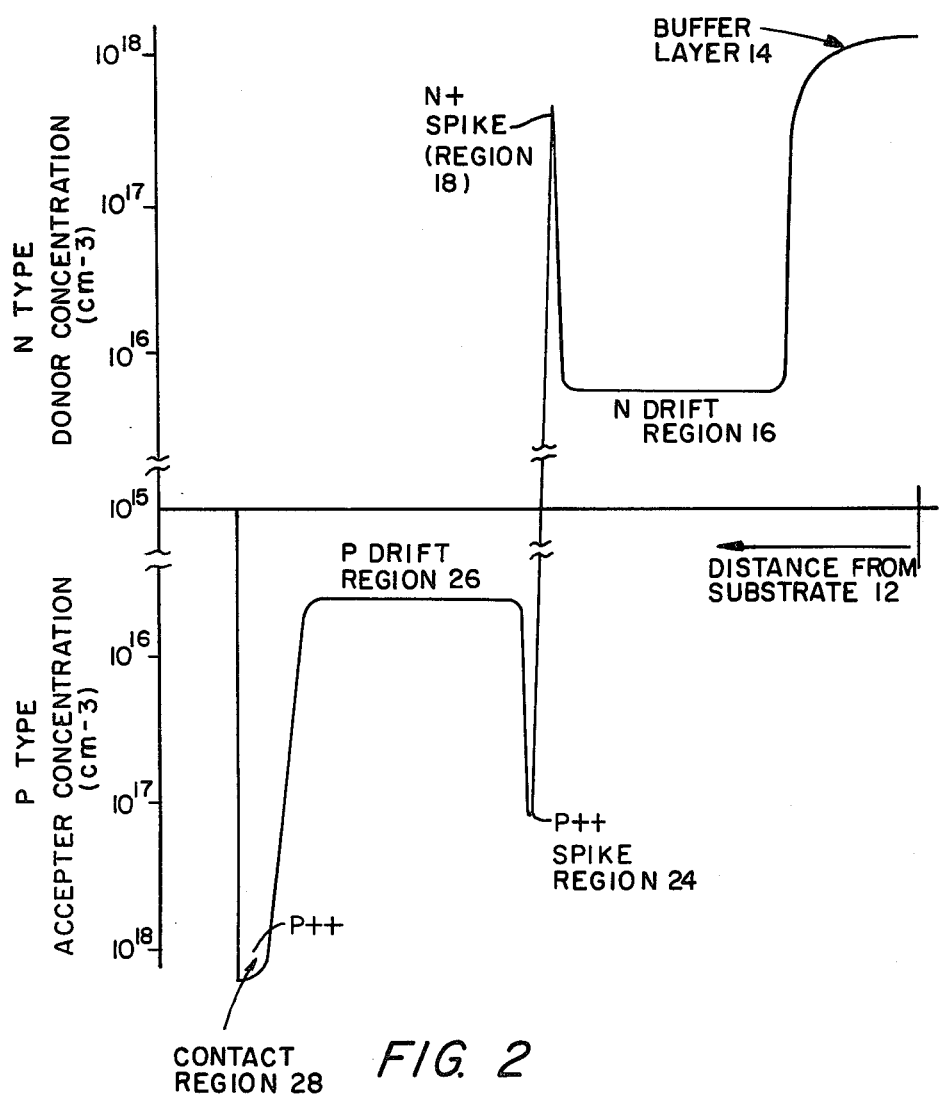
FIG. 2 is a curve showing the doping concentration profile of the diode of FIG. 1.

Referring now also to FIG. 2, the doping concentration profile of diode 10 is shown. Substrate 12 here is n-type doped gallium arsenide having a doping concentration about $10^{18}$ atoms/cm$^3$. Layer 14 provides a buffer, n++ type layer, here having a thickness or width 3 $\mu$m and an n-type doping concentration of about $3 \times 10^{18}$ atoms/cm$^3$. Layers 16, 18 and 20 provide the active n-type doped depletion zone for the diode 10. Layer 16 provides the n-type drift or transit region and here has a width of about 3 $\mu$m and a doping concentration of about $6 \times 10^{15}$ atoms/cm$^3$. Layer 18 is a very thin, high, n-type doped layer, here having a width of about 300–500 Å measured where the doping concentration is 50% below the peak doping concentration of such layer 18, here about $5 \times 10^{17}$ atoms/cm$^3$. Layer 20 provides the n-type avalanche region for the diode 10 and here has a width of about 0.15 $\mu$m and a doping concentration of about $3 \times 10^{16}$/cm$^3$. Layers 22, 24, 26 provide the active p-type doped depletion region for the diode 10. Layer 22 provides the p-type avalanche region, here having a width of about 0.15 $\mu$m and a doping concentration of about $3 \times 10^{16}$/cm$^3$. Layer 24 is a thin p-type doped layer formed to precisely terminate the p-type avalanche region formed by layer 22 in a similar manner as layer 18 terminates the n-type avalanche region formed by layer 20. Here layer 24 has a width of about 0.1 $\mu$m measured at a doping concentration 50% below the peak doping concentration of such layer 24, here about $5 \times 10^{16}$/cm$^3$. Layer 26 provides the p-type drift or transit region for the diode 10 and here has a width of about 2.7 $\mu$m and a p-type doping concentration of about $7.5 \times 10^{15}$. The layer 28 provides a terminating region for the p-type active region and here has a width of about 0.3 $\mu$m and a p-type doping concentration of about $5 \times 10^{18}$/cm$^3$ and also serves as a p++ type contact region.

Figure 3:
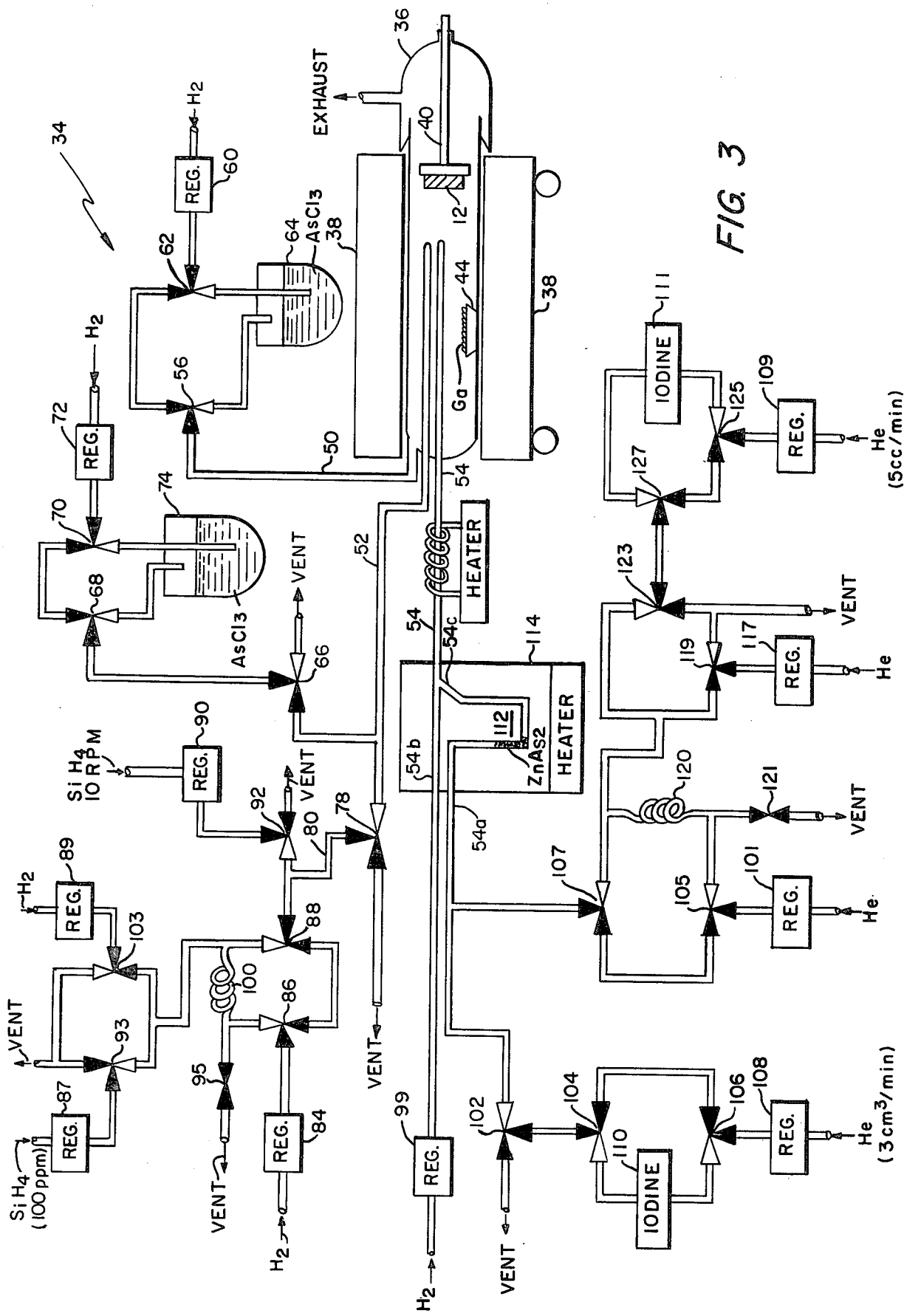
FIG. 3 is a schematic diagram of apparatus suitable for use in the practice of the present invention.

Referring now to FIG. 3, a schematic representation of the open tube vapor phase epitaxy apparatus 34 used in the practice of the invention is shown to include a vapor phase epitaxial reactor, here a fused silica furnace tube 36. Furnace tube 36 is inserted within a multiple zone furnace 38. The substrate 12 of gallium arsenide is placed within furnace tube 36 upon the end of a wafer or substrate support rod 40. The outer surface of substrate 12 is oriented perpendicular to the center axis of the furnace tube 36, as shown. Here substrate 12 is doped with silicon although other n++ type dopants such as Tellurium may be used as well. As noted above in connection with FIG. 2, the doping concentration of substrate 12 is here $1 \times 10^{18}$ atoms (or donors) per cm$^3$.

It is also noted that many separate and identical devices are produced at one time upon substrate 12. The individual devices are scribed and cut from the finished substrate 12. Also placed in the furnace tube 36 is a boat 44, here of fused silica, having metallic gallium deposited therein.

After the substrate 12 and the boat 44 with the metallic gallium are mounted within the furnace tube 36, all atmospheric gases are purged from the interior of the furnace tube 36 and pure hydrogen is introduced into such furnace tube from a hydrogen source as will be described. The temperature within the multiple temperature zone furnace 38 is raised to a desired temperature profile. Here substrate 12 is held at a temperature of 744° C. and the metallic gallium in boat 44 is held at 820° C., thereby placing the gallium in such boat 44 into a liquid state. Other temperatures may be used as well, depending upon the growth rate desired. Two intermediate temperature zones are provided between the gallium in boat 44 and the substrate 12 to provide an approximately linearly declining temperature between boat 44 and substrate 12.

Furnace tube 36 is fed by three fused silica tubes 50, 52, 54. Tube 50, the "grow line", is fed from a solenoid valve 56 which, in its normally inactivated position, enables hydrogen gas to pass from the hydrogen source through a gas flow regulator 60 and deactivated solenoid valves 56, 62 to tube 50 to purge the furnace tube 36, as described above. During epitaxial growth of gallium arsenide on the substrate 12 valves 56, 62 are simultaneously activated, enabling the hydrogen gas to pass through regulator 60, to a bubbler 64 which contains liquid arsenic trichloride (AsCl3), to tube 50. The liquid AsCl3 within bubbler 64 is maintained at a constant temperature in the range of 0° to 20° C. by coolant fluid (not shown) constantly circulating through cooling jackets (not shown) which surround the bubbler 64. The hydrogen gas bubbled through the AsCl3 picks up molecules of AsCl3 as the hydrogen bubbles through the the fluid AsCl3. A mixture of hydrogen and AsCl3 emerges from tube 50 upstream from the boat 44 of gallium.

Tube 52, the "etch/n-type dope" line, is connected, inter alia, to a solenoid valve 66, which, in its normally deactivated state, enables the output of solenoid valve 68 to pass to tube 52. When solenoid valve 68 is in its deactivated state solenoid valve 70 is also in its normally deactivated state and hydrogen gas passes through a gas flow regulator 72 through valves 70, 68, through solenoid valve 66 to tube 52. Such flow also serves to purge furnace tube 36 as described above. Conversely, when valve 68 is activated, valve 70 is also activated simultaneously so that the regulated hydrogen gas passes to a bubbler 74 of liquid AsCl3 (also maintained at a constant temperature in the range of 0° C. to 20° C. as bubbler 64) producing a mixture of hydrogen and AsCl3 which is fed through valves 68 and 66 to line 52. Line 52 is also fed from a solenoid valve 78 which in its deactivated state inhibits gas in tube 80 from passing to tube 52 but rather causes any gas in tube 80 to be vented, as indicated. As will be described hereinafter, when solenoid valve 78 is deactivated, gas in tube 80 is vented enabling tube 52 to receive hydrogen and AsCl3 via valve 66; however, when solenoid 78 is activated an n-type dopant passes from tube 80 to tube 52 to provide the growth of n-type gallium arsenide on substrate 12.

In operation then, after the substrate 12 and boat 44 of gallium are placed in the furnace tube 36 and such tube 36 is purged as described above, the outwardly exposed surface of the substrate 12 is cleaned and etched before growth of the various doped epitaxial layers. When substrate 12 has reached its stable temperature, valves 56, 62, 68 and 70 are activated enabling a mixture of hydrogen and AsCl3 to emerge from tube 50 upstream from the boat 44 of gallium and from tube 52 to emerge downstream from boat 44 of gallium, as shown. The gaseous hydrogen and AsCl3 are in chemical equilibrium at the desired operating temperature with gaseous arsenic and gaseous hydrogen chloride (HCl) in accordance with the following equation:

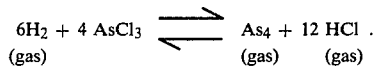

$$6H_2 + 4AsCl_3 \rightleftharpoons As_4 + 12 HCl$$
(gas)     (gas)    (gas)

The gaseous arsenic from tube 50 reacts with the metallic gallium in boat 44 forming a coating of GaAs upon the surface of the metallic gallium. The reaction continues until saturation is reached. The gaseous HCl, primarily from tube 52, etches the surface of substrate 12 thereby freeing it from contaminants.

After the surface of substrate 12 has been etched clean and a saturated coating of GaAs produced atop the supply of metallic gallium in boat 44 the buffer layer 14 (FIG. 1) is grown upon substrate 12. Valves 68, 70 are deactivated while valves 56 and 62 are still activated. A nearly instantaneous transition from vapor etch to epitaxial growth is thereby produced. The exposed and previously etch cleaned surface of substrate 12 acts as a nucleation site for the vapors of GaAs produced atop the metallic gallium in boat 44. During the growth process GaAs is continually produced to replace that consumed by the epitaxial growth process by the continuous flow of vapors from tube 50 across the gallium in boat 44 and are transported by hydrogen gas to the substrate 10.

While GaAs is being epitaxially grown on the surface of substrate 12, n-type dopant material, here silane (SiH4) for growing the n++ buffer layer 14 (FIG. 1) is introduced to tube 52 by activating solenoid valves 78, 86, 88, 93 and 95 and are transported by the hydrogen gas to enable a flow of n-type doping gas to pass through flow regulator 87, through valves 93, 88 and 78 to tube 52. It is also noted that hydrogen gas passes through gas flow regulator 84 and activated valves 86, 88 to tube 80 along with the doping gas. Here silicon is the n-type doping gas and is supplied by SiH4, here at 100 ppm in relationship to the gases mixed therewith in furnace tube 36. The gaseous SiH4 disassociates into gaseous hydrogen and silicon at the preferred operating temperature. Once the buffer layer 14 (FIG. 1) is formed with a width and doping concentration as described in connection with FIG. 2, valves 86 and 88 are simultaneously deactivated while solenoid valve 92 is activated to enable SiH4, here now supplied at a 10 ppm rate, to pass through a gas flow regulator 90, through valves 92 and 78 to tube 52, along with hydrogen gas passing through gas flow regulator 84 and deactivated valves 86, 88, to form the n-type drift region or layer 16 (FIG. 1) with a width and doping concentration described in connection with FIG. 2. It is noted that during the initial portion of the growth of drift layer 16 solenoid valves 103, 95 are deactivated and solenoid valve 93 is activated to enable silane (SiH4) to pass through regulator 87 and hydrogen gas to pass through gas flow regulator 89, through deactivated solenoid valve 103 through a reservoir 100, here a coil-shaped tube of fused silica having a predetermined length for reasons to be described, through valve 95 where they then become vented. This hydrogen and silane gas mixture flow purges reservoir 100 from any concentrated $SiH_4$ gas which may be present as a result of the growth of the buffer layer 14 (FIG. 1) and fills the reservoir 100 with properly diluted hydrogen and silane gas mixture. After such purge, and still during the formation of the growth of layer 16 (FIG. 1), solenoid valves 95 and 103 are activated and solenoid valve 93 is deactivated to prevent a further flow of the gas mixture to the reservoir 100 and to enable a predetermined volume of $SiH_4$, here about 5 cm$^3$, to provide the doping concentration in the thin, highly n-type doped layer 18 to be stored in such reservoir 100 and equilibrate with walls of such reservoir 100 (FIG. 3). Once the n-type drift region or layer 16 (FIG. 1) is grown to the width described in connection with FIG. 2, solenoid valves 86, 88 are simultaneously activated and hydrogen gas passing through regulator 84 passes through reservoir 100 driving the entire predetermined quantity of $SiH_4$ gas previously stored therein quickly through valve 88 and through still activated valve 78 to tube 52. The thin layer 18 (FIG. 1) is grown during the short time that n-type dopant, here the $SiH_4$ gas stored in reservoir 100 flows to the furnace tube 86. Of course, GaAs deposition occurs on the surface of the substrate 12 during this period of time. When the constant volume reservoir 100 is emptied, n-type avalanche layer 20 (FIG. 1) is sequentially grown on the thin layer 18 by $SiH_4$ gas which continues to flow through activated solenoid valve 92 until such n-type avalanche region or layer 20 has a width and doping concentration as described in connection with FIG. 2. It is noted that valve 92 is activated during the time the thin layer 18 is formed.

Figure 4:
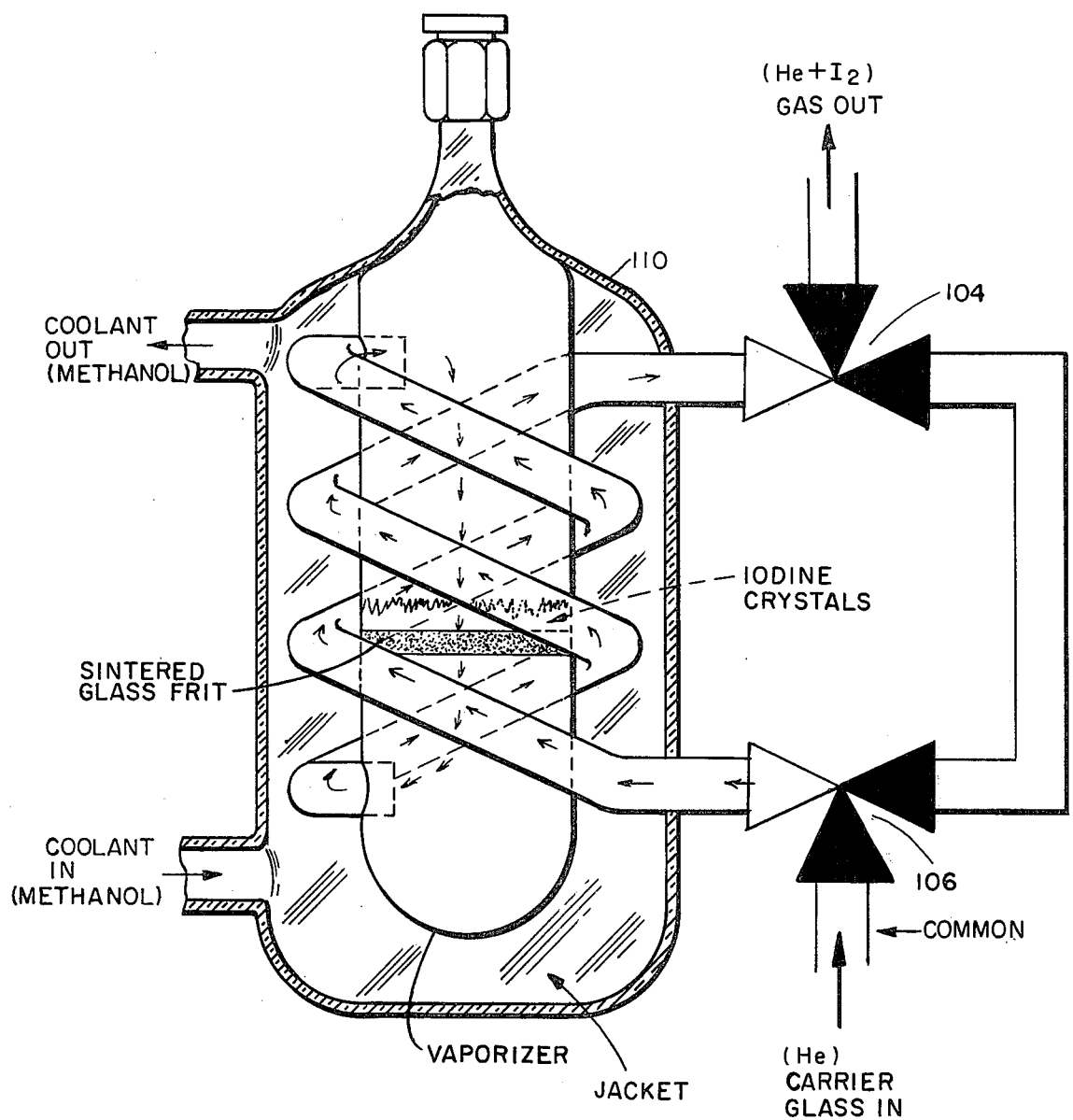
FIG. 4 is a diagram showing an iodine container used in the apparatus of FIG. 3.

After completion of the growth of the n-type doped layers 14, 16, 18, 20 (FIG. 1), the p-type layers 22, 24, 26 and 28 (FIG. 1) are formed. Here solenoid valve 78 is deactivated, preventing further doping gas flow in tube 52. Simultaneously therewith, solenoid valve 102 is activated. It is here noted that during the growth of the n-type doping layers 14, 16, 18, 20 (FIG. 1), solenoid valves 104 and 106 were activated. It follows, then, that when solenoid valve 102 is activated the growth of the p-type avalanche region is started. In particular, an inert gas, here helium, which flows through gas flow regulator 108 passes through vapors of iodine produced in container 110 producing a flow of helium plus iodine which passes through now activated valve 102 to a fused silica tube 54a into a retort 112. The container 110 is here an iodine vaporizer cooled to a constant temperature, here $-15°$ C., by circulating cooled methanol through a jacket (shown in detail in FIG. 4) surrounding the vaporizer. With such arrangement, the entering helium, the iodine, and the He+$I_2$ that leave the unit 110 are all cooled. This allows the helium to become saturated, but not supersaturated, with the iodine. The vaporized iodine is fed to retort 112, such retort 112 having stored therein solid zinc arsenide ($Zn_3As_2$) or ($ZnAs_2$). The retort 112 is enclosed in a retort furnace 114, as shown, to heat the zinc arsenide to a temperature here between 300° C. and 450° C. The zinc arsenide was previously loaded in the form of chunks approximately 3 millimeters across so that they were able to be inserted into the retort 112, here formed of a loop of a 6 millimeter diameter fused silica tubing. A 6 millimeter diameter silica tube 54c leads from the retort 112 to tube 54, here also 6 millimeters in diameter, along with tube 54b, as shown. Tube 54 enters the furnace tube 36 between the boat 44 of gallium and the substrate 12, as shown. A heater surrounds the portion of tube 54 disposed between the point where tubes 54b, 54c merge to form tube 54 and the point where tube 54 enters furnace tube 36, as shown, here heating the passing vapors to about 370°–410° C. Tube 54b is a by-pass tube, also made of fused silica, and joins the heated portion of tube 54 immediately downstream of the retort 112 and directs a continual flow of helium (or hydrogen) passing through regulator 99 to keep tube 54 continuously flushed clean when no p-type doping is required.

The chemical reaction between the solid zinc arsenide and the iodine vapor in the retort 112 produces a gaseous or vapor dopant $ZnI_2$ which is fed through tube 54c and is transported by the helium (or hydrogen) entering tube 54b into the furnace tube 36. It is noted that prior to the growth of the p-type doping layers and during the growth of the n-type layers, helium passes through gas flow regulator 101 and deactivated solenoid valves 105, 107 through tube 54a to retort 112 to flush tube 54a. The partial pressure of zinc over the zinc arsenide in retort 112 is relatively low at a retort temperature of 350° C. to 400° C. so that little zinc enters the furnace tube 36 vapor stream when this helium alone is passed over the zinc arsenide to flush tube 54a. That is, the vapor pressure of the zinc arsenide at the retort temperature is relatively low, typically about $2\times10^{-7}$ atmospheres. Therefore, there is substantially no p-type dopant introduced into the furnace tube 36 during the growth of the n-type doped layers. Under the same conditions, however, when valve 102 is activated, the iodine vapors passing into the retort 112 chemically react with the zinc arsenide and volatile $ZnI_2$ is formed. The vapor pressure of the $ZnI_2$ at the retort temperature is at least an order of magnitude greater than the vapor pressure of the zinc arsenide at such temperature. Typically, the vapor pressure of the $ZnI_2$ at 350° C. is about $4\times10^{-4}$ atmospheres. The chemical reaction is relatively rapid and complete so that the zinc now transported into the furnace tube 36 is chiefly controlled by the flow of vaporized iodine passing to the retort 112. This flow of iodine vapor is in effect controlled by the flow of helium through gas regulator 108 and the temperature of the iodine stored in container 110. That is, the p-type doping levels are adjusted by controlling the temperature of the zinc arsenide and the iodine vapor flow rate over the temperature regulated zinc arsenide. The iodine vapor flow rate being determined by the temperature of the iodine and the flow rate of the helium fed to the iodine, at selected retort temperatures above a minimum and up to a saturation value, the acceptor incorporation in the growing epitaxial layer is proportional to the flow of iodine vapor. That is, the flow rate of zinc iodide is substantially proportional to the flow rate of the iodine vapor and is substantially independent of the flow rate of the hydrogen gas passing through tube 50. A desired doping range is adjusted by varying the iodine flow rate through retort 112. For example, with a flow of helium of 3 cm$^3$ per minute through iodine vapors formed by cooling iodine in container 110 at a temperature of $-15°$ C., 0.03 ppm of iodine vapor is produced. With the temperature of retort 112 at 350° C., this 0.03 ppm of iodine vapor produces a p-type doping concentration of $5\times10^{15}$ acceptors per cm$^3$. To suppress the n-type background doping and to obtain high quality p-type gallium arsenide, it is necessary to set the arsenic trichloride mole fraction relatively high during growth of the p-type layer by maintaining the temperature of bubbler 64 at a relatively high temperature, here 16° C.

During the formation of the n-type doped layers described above, helium passing through gas flow regulator 117 passes through deactivated solenoid valve 119, through a reservoir 120, here a fused silica tube having a predetermined volume similar to reservoir 100, and is vented through deactivated solenoid valve 121 to flush such reservoir. Once flushed, and still during the growth of the n-type layer (i.e., valves 105, 107, and 121 being deactivated) valves 123, 125 and 127 are activated, enabling a flow of helium gas to pass through gas flow regulator 109, through iodine container 111, through reservoir 120 and valve 121 to become vented. Here the helium flows at a rate of 5 cc/min. and the temperature of the methanol cooling iodine stored in container 111 (similar in construction to container 110 which is shown in detail in FIG. 4) is $+15°$ C., thereby producing a relatively large concentration of iodine vapors which fill reservoir 120. Once the predetermined concentration of iodine vapor fills reservoir 120, valves 119 and 123 are deactivated and 121 is activated to enable such reservoir 120 to store a predetermined volume of such iodine vapors. After the p-type avalanche region or layer 22 is formed to a width and doping concentration as described in connection with FIG. 2, solenoid valves 105 and 107 are simultaneously activated so that helium passing through regulator 101 and valve 105 drives the iodine vapor stored in reservoir 120 through valve 107 and tube 54a to retort 112. The fixed volume of the reactive iodine vapor produces a corresponding fixed volume of $ZnI_2$ as a result of the chemical reaction between the zinc arsenide and the iodine vapor. The $ZnI_2$ gas is transported to furnace tube 36 by the hydrogen in tube 54b. This flow of $ZnI_2$ gas produced by the chemical reaction of the stored iodine vapor in reservoir 120 produces the thin, high p-type doped layer 22 (FIG. 1). The quantity of iodine vapor stored in reservoir 120 is selected to enable production or growth of the thin layer 24 with a width and doping concentration described in connection with FIG. 2.

After the stored iodine vapors are released and fully reacted with the $Zn_3As_2$ or $ZnAs_2$ in retort 112, the p-type drift region or layer 26 (FIG. 1) is grown by the flow of iodine vapors passing through activated valve 102 (such valve having been activated during the growth of the p-type avalanche region or layer 22 and having remained activated during the growth of the thin, p-type layer 24). After growth of the p-type drift region or layer 26 by p-type dopant produced as a result of chemically reacting a flow of iodine vapor from container 110 through the $Zn_3As_2$ stored in retort 112 to a width and doping concentration described in connection with FIG. 2, solenoid valve 102 is deactivated and simultaneously therewith solenoid valves 105, 107, 123, 125, 127, 121 are activated to enable helium passing through regulator 109 at 5 cc/min. to carry iodine vapor from container 111 through valves 127, 123 and 107 to tube 54a. This iodine vapor reacts with the zinc arsenide in retort 112 to produce $ZnI_2$ gas which is used as the dopant gas in the formation of the contact layer 28 (FIG. 1). Here again, the chemical reaction is relatively rapid and complete so that the zinc now transported into the furnace tube 36 is chiefly controlled by the flow of vaporized iodine passing to the retort 112.

All solenoid valves are deactivated when growth is complete.

It should be noted that while the process described above uses iodine vapor transported by helium to zinc arsenide via tube 54a, such iodine vapor may be transported using hydrogen instead of helium. Alternatively, instead of transporting iodine vapors to valves 102 and 123 by helium or hydrogen, sources of hydrogen iodine (HI) may be fed to valves 123, 102, the HI source fed to value 123 being, for example, 10,000 ppm and HI source fed to value 104 being, for example, 100 ppm. Alternatively, a compound of bromine, such as bromine vapor $Br_2$ or hydrogen bromide HI may be used to react with the zinc arsenide.

Once the p-type layers 22, 24, 26, 28 have been grown as described, the substrate 12 is cooled and the tube 36 is purged. The substrate 12 is then removed from the furnace tube 36. Individual devices are then cut out and gold or gold alloy ohmic contacts are formed as shown in FIG. 1 as described above.

Figure 5:
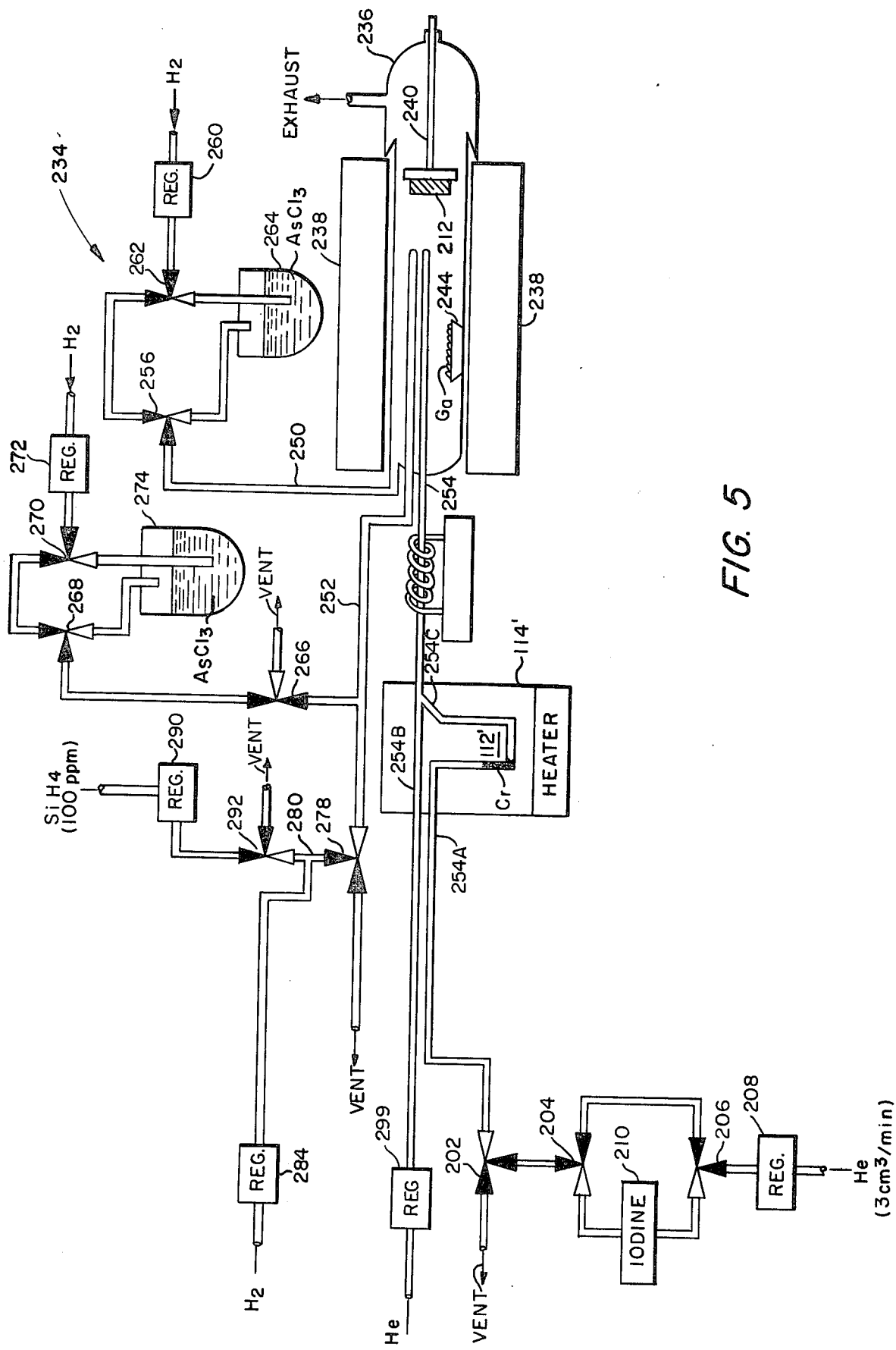
FIG. 5 is a schematic diagram of apparatus suitable for use in forming chromium doped gallium arsenide layers.

Referring now to FIG. 5, a schematic representation of apparatus 234 used to deposit a chromium doped layer on a gallium arsenide substrate is shown to include a vapor phase epitaxial reactor, here a fused silica furnace tube 236. Furnace tube 236 is inserted within a multiple zone furnace 238. The substrate 212 of gallium arsenide is placed within furnace tube 236 upon the end of a wafer or substrate support rod 240. The outer surface of substrate 212 is oriented perpendicular to the center axis of the furnace tube 236, as shown. Here substrate 212 is doped with chromium although other semi-insulating substrates may be used as well. The doping concentration of substrate 212 is here $10^7$ ohm-cm or greater. It is also noted that many separate and identical devices are produced at one time upon substrate 212. The individual devices are scribed and cut from the finished substrate 212. Also placed in the furnace tube 236 is a boat 244, here of fused silica, having metallic gallium deposited therein.

After the substrate 212 and the boat 244 with the metallic gallium are mounted within the furnace tube 236, all atmospheric gases are purged from the interior of the furnace tube 236 and pure hydrogen is introduced into such furnace tube from a hydrogen source as will be described. The temperature within the multiple temperature zone furnace 238 is raised to a desired temperature profile. Here substrate 212 is held at a temperature of 744° C. and the metallic gallium in boat 244 is held at 820° C., thereby placing the gallium in such boat 244 into a liquid state. Other temperatures may be used as well, depending upon the growth rate desired. Two intermediate temperature zones are provided between the gallium in boat 244 and the substrate 212 to provide an approximately linearly declining temperature between boat 244 and substrate 212.

Furnace tube 236 is fed by three fused silica tubes 250, 252, 254. Tube 250, the "grow line", is fed from a solenoid valve 256 which, in its normally inactivated position, enables hydrogen gas to pass from hydrogen source through a gas flow regulator 260 and deactivated solenoid valves 256, 262 to tube 250 to purge the furnace tube 236, as described above. During epitaxial growth of gallium arsenide on the substrate 212 valves 256, 262 are simultaneously activated, enabling the hydrogen gas to pass through regulator 260, to a bubbler 264 which contains liquid arsenic trichloride ($AsCl_3$), to tube 250. The liquid $AsCl_3$ within bubbler 264 is maintained at a constant temperature in the range of 0° to 20°

C. by coolant fluid (not shown) constantly circulating through cooling jackets (not) shown) which surround the bubbler 264. The hydrogen gas bubbled through the AsCl₃ picks up molecules of AsCl₃ as the hydrogen bubbles through the fluid AsCl₃. A mixture of hydrogen and AsCl₃ emerges from tube 250 upstream from the boat 244 of gallium.

Tube 252, the "etch/n-type dope" line, is connected, inter alia, to a solenoid valve 266, which, in its normally deactivated state, enables the output of solenoid valve 268 to pass to tube 252. When solenoid valve 268 is in its deactivated state hydrogen gas passes through a gas flow regulator 272 through valves 270, 268, through solenoid valve 266 to tube 252. Such flow also serves to purge furnace tube 236 as described above. Conversely, when valve 268 is activated, valve 270 is also activated simultaneously so that the regulated hydrogen gas passes to a bubbler 274 of liquid AsCl₃ (also maintained at a constant temperature in the range of 0° C. to 20° C. as bubbler 264) producing a mixture of hydrogen and AsCl₃ which is fed through valves 268 and 266 to line 252. Line 252 is also fed from a solenoid valve 278 which in its deactivated state inhibits gas in tube 280 from passing to tube 252 but rather causes any gas in tube 280 to be vented, as indicated. As will be described hereinafter, when solenoid valve 278 is deactivated, gas in tube 280 is vented enabling tube 252 to receive hydrogen and AsCl₃ via valve 266; however, when solenoid 278 is activated an n-type dopant passes from tube 280 to tube 252 to provide the growth of n-type gallium arsenide on substrate 212. After the surface of substrate 212 has been etched clean and a coating of GaAs produced atop the supply of metallic gallium saturated with arsenic in boat 244 a buffer layer is grown upon substrate 212. Valves 268 and 270 are deactivated while valves 204, 206 and 202 are activated. A nearly instantaneous transition from vapor etch to epitaxial growth is thereby produced. The exposed and previously etch-cleaned surface of substrate 212 acts as a nucleation site for the vapors of GaAs produced atop the metallic gallium in boat 244. During the growth process GaAs is continually produced to replace that consumed by the epitaxial growth process by the continuous flow of vapors from tube 250 across the gallium in boat 244.

The iodine vapor from vaporizer 210, held at a constant temperature as previously described in connection with vaporizer 110 (FIG. 4), is carried by helium passing through regulator 208, solenoid valves 206 and 204, through valve 202 and tube 254A over the chromium metal held in the retort 112', here heated by 114' to a temperature of 500° C. to 750° C., where it reacts to form $CrI_2$ vapor which is carried through heated tube 254 into the reactor tube upstream of the substrate 212. There it mingles with the gallium arsenide vapors, impinging on substrate 212, depositing with the growing gallium arsenide layer, doping the buffer layer and causing it to be electrically semi-insulating. The amount of $CrI_2$ in the vapor stream should be between 0.1 and 10 ppm with the preferred level about 2 ppm to achieve good electrical characteristics. While the buffer layer is being grown, valve 292 is activated to purge the line. When the specified buffer layer thickness, typically about 4 μm, is grown, valve 102 is deactivated and valve 278 is activated to grow an active n-type doped layer for a field effect device, with the doping level adjusted to the desired level by the setting of flow regulator 290. After 0.3 to 0.6 μm of active at $1 \times 10^{17}$ donors is grown, the flow through 290 is increased by adjusting flow regulator 290 to a flow twenty time or more higher to grow the contact layer. When the specified contact layer is grown 256 and 262, as well as 278, are deactivated.

Having described preferred embodiments of the invention, other embodiments incorporating these concepts will now become apparent to those of skill in the art. For example, a double drift IMPATT diode may be fabricated on a p-type gallium arsenide substrate by first growing a sequence of p-type doped layers and then a sequence of n-type doped layers. It is felt, therefore, that this invention should not be restricted to the disclosed embodiment, but rather should be limited only by the spirit and scope of the appended claims.

What is claimed is:

1. A method for producing a doped gallium arsenide semiconductor layer comprising the steps of:
    (a) directing a predetermined flow of a reactive substance selected from a group consisting of: iodine, a compound of iodine, bromine, or a component of bromine, over a material having a dopant;
    (b) chemically reacting the reactive substance with such material producing a corresponding flow of a doping vapor having the dopant, such doping vapor having a vapor pressure at a predetermined temperature at least an order of magnitude greater than the vapor pressure of the material at said predetermined temperature; and
    (c) depositing the doped gallium arsenide semiconductor layer on a gallium arsenide substrate by vapor phase epitaxy from material including a source of gallium and arsenic and the doping vapor.

2. The method recited in claim 1 wherein the material having the dopant is selected from a group consisting of zinc arsenide or chromium.

3. A method for producing a doped gallium arsenide semiconductor layer, comprising:
    (a) directing a predetermined flow of a reactive substance selected from a group consisting of iodine, hydrogen iodide, bromine or hydrogen bromide, over a material having a dopant, such material being of a group consisting of zinc arsenide or chromium;
    (b) chemically reacting the reactive substance with the material producing a corresponding flow of a doping vapor; and
    (c) depositing the doped gallium arsenide semiconductor layer on a gallium arsenide substrate by vapor phase epitaxy from material including the doping vapor.

4. A method for producing a doped layer of gallium arsenide semiconductor layer comprising the steps of:
    (a) directing a predetermined flow of a reactive substance selected from a group consisting of: iodine, a compound of iodine, bromine, or a compound of bromine, over a first material having as a substantial fractional element thereof a dopant;
    (b) chemically reacting the reactive substance with such first material producing a corresponding flow of a doping vapor having the dopant; and
    (c) depositing the doped gallium arsenide semiconductor layer on a gallium arsenide substrate by vapor phase epitaxy from a second material including a source of the gallium and arsenic and the doping vapor, such second material and the doping vapor being transported to the substrate by a carrier gas of hydrogen, the flow of the carrier gas being controllable independently from the flow of the reactive substance.

5. A method for producing a relatively narrow, high doping concentration layer between a pair of lower doping concentration layers, comprising the steps of:
   (a) directing a flow of a predetermined quantity of a reactive substance to a material having a doping element, the predetermined quantity being related to the doping concentration of the narrow, high doping concentration layer;
   (b) chemically reacting the predetermined quantity of the material producing a flow of a corresponding quantity of a doping vapor;
   (c) depositing such narrow, high doping concentration layer on a layer of semiconductor material having a relatively low doping concentration, such deposition being by vapor phase epitaxy from materials including the doping vapor; and
   (d) producing by vapor phase epitaxy a relatively lower doped semiconductor layer on the narrow, high doping concentration layer.

6. A method for forming a semiconductor device comprising the steps of:
   (a) forming at least one p-type doped gallium arsenide layer by vapor phase epitaxy comprising the steps of: chemically reacting a substance with a material having a p-type doping element producing a doping vapor having the p-type dopant;
   (b) forming at least one n-type gallium arsenide layer; and wherein such at least one p-type and at least one n-type gallium arsenide layers are formed contiguous one to the other.

7. A method for producing a doped gallium arsenide semiconductor layer comprising the steps of:
   (a) directing a predetermined flow of a compound of iodine or iodine over a doped material, such doped material being selected from the group consisting of material having an elemental zinc or an elemental chromium;
   (b) chemically reacting the compound with the doped material producing a corresponding flow of a doping vapor, such doping vapor being a material from the group consisting of zince iodide or chromium iodide; and
   (c) depositing the doped gallium arsenide layer on a gallium arsenide substrate by vapor phase epitaxy from material including a source of arsenic, a source of gallium and the doping vapor, such being transported to the substrate by a carrier gas of hydrogen.

8. A method for producing a doped gallium arsenide semiconductor layer comprising the steps of:
   (a) directing a predetermined flow of a compound over a doped material, such compound being a material selected from the group consisting of iodine or a compound of iodine, or bromine, or a compound of bromine, such doped material being selected from the group consisting of material having an elemental zinc or an elemental chromium;
   (b) chemically reacting the compound with the doped material producing a corresponding flow of a doping vapor, such doping vapor being of a material selected from the group consisting of zinc iodide, zinc bromide, chromium iodide, or chromium bromide; and
   (c) depositing the doped gallium arsenide layer on a gallium arsenide substrate by vapor phase epitaxy from material including a source of arsenic, a source of gallium and the doping vapor, such being transported to the substrate by a carrier gas of hydrogen.

9. A method for producing a relatively narrow, high doping concentration layer between a pair of lower doping concentration layers, comprising the steps of:
   (a) directing a flow of a predetermined quantity of a reactive substance to a material having a doping element, the predetermined quantity being related to the doping concentration of the narrow, high doping concentration layer;
   (b) chemically reacting the predetermined quantity of the material producing a flow of a corresponding quantity of a doping vapor;
   (c) depositing such narrow high doping concentration layer on a layer of semiconductor material having a relatively low doping concentration, such deposition being by vapor phase deposition from materials including the doping vapor, such narrow high doping concentration layer having a width of about 0.1 micrometers at a doping concentration 50% below the peak doping concentration of such layer; and
   (d) producing by vapor phase deposition a relatively lower doped semiconductor layer on the narrow, high doping concentration layer.

10. A method for producing a doped semiconductor layer comprising the steps of:
    (a) directing a predetermined flow of a reactive substance selected from a group consisting of: iodine, a compound of iodine, bromine, or a compound of bromine, over a material having a dopant;
    (b) chemically reacting the reactive substance with such material producing a corresponding flow of a doping vapor having the dopant, such doping vapor having a vapor pressure at a predetermined temperature at least an order of magnitude greater than the vapor pressure of the material at said predetermined temperature; and
    (c) depositing the doped semiconductor layer on a substrate by vapor phase deposition from material including a source of the semiconductor and the doping vapor.

11. A method for producing a doped semiconductor layer comprising the steps of:
    (a) directing a predetermined flow of a reactive substance selected from the group consisting of: iodine, a compound of iodine, bromine, or a compound of bromine over a first material having as substantial fractional element thereof a dopant;
    (b) chemically reacting the reactive substance with such first material producing a corresponding flow of a doping vapor having the dopant; and
    (c) depositing the doped semiconductor layer on a substrate by vapor phase deposition from a second material including a source of the semiconductor and the doping vapor, such second material and the doping vapor being transported to the substrate by a carrier gas, the flow of the carrier gas being controllable independently from the flow of the reactive substance.

12. The method recited in claim 11 wherein the carrier gas is hydrogen.

13. A method for forming a semiconductor device comprising the steps of:
    (a) forming at least one p-type doped semiconductor layer by vapor phase deposition comprising the step of chemically reacting a substance with a material having a p-type doping element producing a doping vapor having the p-type dopant; and (b) forming at least one n-type semiconductor layer by vapor phase deposition and wherein such at least one p-type and at least one n-type semiconductor layers are contiguous one to the other and wherein the same carrier gas is used during the vapor phase deposition of both the n-type and p-type semiconductor layers.

* * * * *